(12) United States Patent
Kouno

(10) Patent No.: US 10,170,607 B2
(45) Date of Patent: Jan. 1, 2019

(54) SEMICONDUCTOR DEVICE

(71) Applicant: DENSO CORPORATION, Kariya, Aichi-pref. (JP)

(72) Inventor: Kenji Kouno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/740,573

(22) PCT Filed: Aug. 8, 2016

(86) PCT No.: PCT/JP2016/073244
§ 371 (c)(1),
(2) Date: Dec. 28, 2017

(87) PCT Pub. No.: WO2017/038389
PCT Pub. Date: Mar. 9, 2017

(65) Prior Publication Data
US 2018/0197977 A1 Jul. 12, 2018

(30) Foreign Application Priority Data

Aug. 28, 2015 (JP) .................................. 2015-169396

(51) Int. Cl.
*H01L 29/739* (2006.01)
*H01L 27/04* (2006.01)
(Continued)

(52) U.S. Cl.
CPC .......... *H01L 29/7397* (2013.01); *H01L 27/04* (2013.01); *H01L 27/0664* (2013.01);
(Continued)

(58) Field of Classification Search
CPC ............. H01L 29/7397; H01L 29/0696; H01L 29/0821; H01L 29/1095; H01L 29/32;
(Continued)

(56) References Cited

U.S. PATENT DOCUMENTS

| 4,587,547 A | 5/1986 | Amemiya et al. |
| 4,969,028 A | 11/1990 | Baliga |

(Continued)

FOREIGN PATENT DOCUMENTS

| JP | H02-066977 A | 3/1990 |
| JP | 2013-065735 A | 4/2013 |
| JP | 2015-154000 A | 8/2015 |

*Primary Examiner* — Ermias Woldegeorgis
(74) *Attorney, Agent, or Firm* — Posz Law Group, PLC

(57) ABSTRACT

A semiconductor device has a semiconductor substrate including a first conductivity-type drift layer, a second conductivity-type base layer disposed in a surface layer portion of the drift layer, and a second conductivity-type collector layer and a first conductivity-type cathode layer disposed opposite to the base layer with respect to the drift layer. In the semiconductor substrate, an IGBT region and a diode region are alternately and repetitively arranged. The IGBT region and the diode region are divided by a boundary between the collector layer and the cathode layer. The collector layer is defined as a first collector layer. The semiconductor device includes a second collector layer having a second conductivity-type impurity concentration higher than that of the first collector layer, at a surface of the semiconductor substrate adjacent to the first collector layer and the cathode layer.

7 Claims, 9 Drawing Sheets

(51) Int. Cl.
    *H01L 29/861*     (2006.01)
    *H01L 29/868*     (2006.01)
    *H01L 27/06*     (2006.01)
    *H01L 29/08*     (2006.01)

(52) U.S. Cl.
    CPC ...... *H01L 29/0821* (2013.01); *H01L 29/0834* (2013.01); *H01L 29/739* (2013.01); *H01L 29/861* (2013.01); *H01L 29/868* (2013.01)

(58) Field of Classification Search
    CPC ... H01L 29/36; H01L 29/8605; H01L 29/861; H01L 29/8611
    See application file for complete search history.

(56) References Cited

U.S. PATENT DOCUMENTS

| | | |
|---|---|---|
| 6,204,717 B1 | 3/2001 | Nagasu et al. |
| 6,414,370 B1 | 7/2002 | Nagasu et al. |
| 6,552,413 B1 | 4/2003 | Hirano et al. |
| 2002/0125548 A1 | 9/2002 | Nagasu et al. |
| 2004/0056702 A1 | 3/2004 | Nagasu et al. |
| 2007/0158680 A1* | 7/2007 | Ozeki ................. H01L 27/0664 257/146 |
| 2011/0193132 A1 | 8/2011 | Kouno et al. |
| 2012/0068220 A1 | 3/2012 | Kobayashi et al. |
| 2012/0132954 A1 | 5/2012 | Kouno et al. |
| 2013/0001639 A1* | 1/2013 | Iwasaki ................. H01L 21/761 257/140 |
| 2016/0247808 A1 | 8/2016 | Horiuchi et al. |

\* cited by examiner

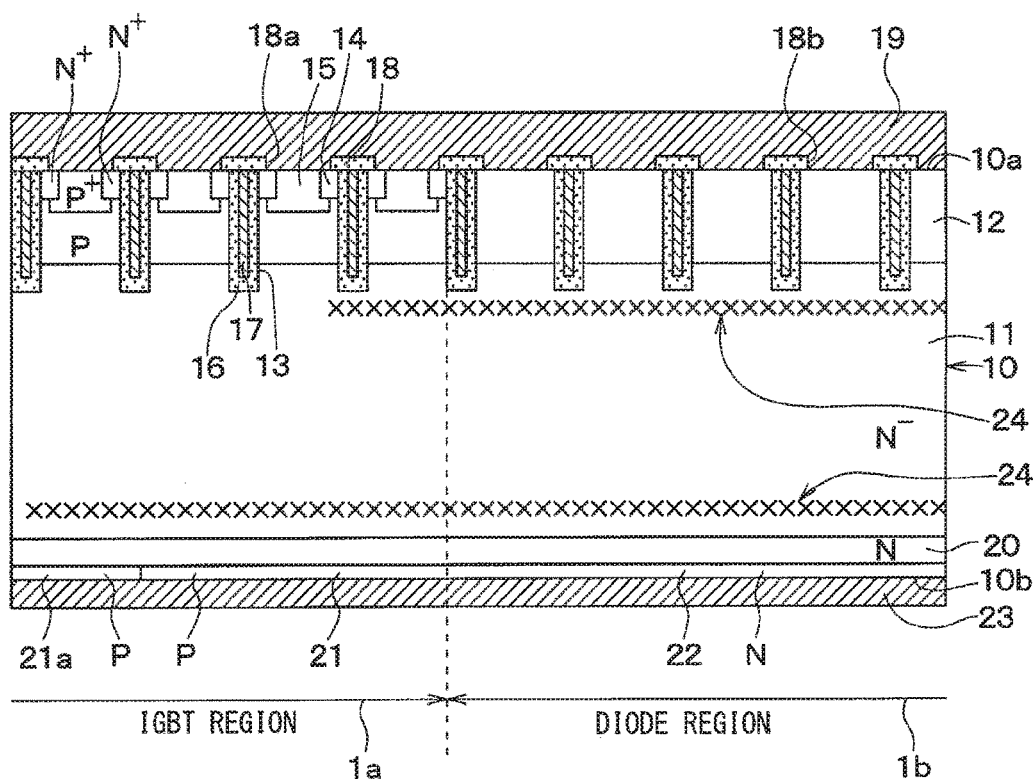

SEMICONDUCTOR DEVICE

CROSS REFERENCE TO RELATED APPLICATIONS

This application is a U.S. national stage application of International Application No. PCT/JP2016/073244 filed on Aug. 8, 2016 and is based on Japanese Patent Application No. 2015-169396 filed on Aug. 28, 2015, the disclosures of which are incorporated herein by reference.

TECHNICAL FIELD

The present disclosure relates to a semiconductor device having an IGBT region formed with an insulated gate bipolar transistor (hereinafter referred to as the IGBT) and a diode region formed with a free-wheeling diode (hereinafter referred to as the FWD).

BACKGROUND

For example, it has been known a semiconductor device having a reverse-conducting IGBT (hereinafter referred to as RC-IGBT) structure in which an IGBT and a FWD are formed in one chip, as a switching element to be used to an inverter or the like. (For example, see Patent Literature 1.)

In the semiconductor device, a base layer is disposed in a surface layer portion of a semiconductor substrate forming an n$^-$-type drift layer. The semiconductor substrate has a trench gate structure that penetrates through the base layer. A p-type collector layer and an n-type cathode layer are disposed on a back surface of the semiconductor substrate. N-type emitter regions are disposed in a part of the base layer located above the collector layer. An n-type field stop layer (hereinafter referred to as the FS) is disposed in the drift layer at a position corresponding to a boundary between the collector layer and the emitter layer. Further, an upper electrode is disposed adjacent to a front surface of the semiconductor substrate to be electrically connected to the base layer and the emitter regions, and a lower electrode is disposed adjacent to the back surface of the semiconductor substrate to be electrically connected to the collector layer and the cathode layer.

In such a structure, a region having the collector layer on the back surface of the semiconductor substrate serves as an IGBT region, and a region having the cathode layer on the back surface of the semiconductor serves as a diode region. That is, in the semiconductor device described above, the boundary between the collector layer and the cathode layer corresponds to the boundary between the IGBT region and the diode region.

PATENT LITERATURE

Patent Literature 1: JP2011-181886A

SUMMARY

In a structure having an IGBT region and a FWD region in one chip, an impurity concentration of a p-type collector layer is relatively low in consideration of switching loss of the IGBT. Therefore, during a recovery operation of the FWD, holes are not sufficiently injected from the low concentration collector layer in the IGBT region. As a result, a recovery waveform oscillates, and a surge voltage is likely to easily increase.

On the other hand, if the impurity concentration of the collector layer is increased, since the amount of hole injection increases, the oscillation of the recovery waveform can be reduced, and the surge voltage can be reduced. However, the switching loss of the IGBT increases. That is, the reduction of the surge voltage in the recovery operation and the reduction of the switching loss of the IGBT have a trade-off relationship, and were difficult to be compatible. Specifically, in a fine trench gate structure in which a distance between adjacent trench gate structures is reduced, which has been recently employed, since a hole-accumulation effect is high, the holes are easily accumulated in a semiconductor substrate. Therefore, it is necessary to reduce the impurity concentration of the collector layer on a back side of the semiconductor substrate not to harm the switching loss. As a result, the oscillation of the recovery waveform of the FWD is more notable.

It is an object of the present disclosure to provide a semiconductor device which is capable of restricting a surge voltage during recovery and reducing switching loss of an IGBT.

According to a first aspect of the present disclosure, a semiconductor device has a semiconductor substrate including: a first conductivity-type drift layer; a second conductivity-type base layer disposed in a surface layer portion of the drift layer; and a second conductivity-type collector layer and a first conductivity-type cathode layer disposed opposite to the base layer with respect to the drift layer. In the semiconductor device, a region of the semiconductor substrate operating as an IGBT element is referred to as an IGBT region, and a region of the semiconductor substrate operating as a diode element is referred to as a diode region. The IGBT region and the diode region are alternately and repetitively arranged. The IGBT region and the diode region are divided from each other at a boundary between the collector layer and the cathode layer. The collector layer is referred to as a first collector layer. The semiconductor device further has a second collector layer at a surface of the semiconductor substrate adjacent to the first collector layer and the cathode layer. The second collector layer has a second conductivity-type impurity concentration higher than that of the first collector layer.

As described above, the semiconductor device has the second collector layer having the second conductivity-type impurity concentration higher than that of the first collector layer. In this structure, oscillation of a recovery waveform, that is, an oscillation voltage can be restricted, and thus the surge voltage can be restricted. Further, since the second collector layer is provided only at a part of a collector, switching loss can be also restricted.

According to a second aspect of the present disclosure, a semiconductor device has a semiconductor substrate including: a first conductivity-type drift layer; a second conductivity-type base layer disposed in a surface layer portion of the drift layer; a field stop layer disposed opposite to the base layer with respect to the drift layer, the field stop layer having a first conductivity-type impurity concentration higher than a first conductivity-type impurity concentration of the drift layer; and a second conductivity-type collector layer and a first conductivity-type cathode layer that are disposed opposite to the drift layer with respect to the field stop layer. In the semiconductor device, a region of the semiconductor substrate operating as an IGBT element is referred to as an IGBT region, and a region of the semiconductor substrate operating as a diode element is referred to as a diode region. The IGBT region and the diode region are alternately and repetitively arranged. The IGBT region and the diode region are divided from each other by a boundary between the collector layer and the cathode layer. The semiconductor device further includes a low concentration filed stop layer in the field stop layer and at a position corresponding to the boundary between the collector layer and the cathode layer, the low concentration field stop layer having a first conductivity-type impurity concentration lower than that of portions of the field stop layer in the IGBT region and in the diode region other than the low concentration field stop layer.

When having the low concentration FS layer as described above, the semiconductor device can be made to a state where the second conductivity-type impurity is larger by controlling balance of the impurity concentration of the PN junction. As such, the switching loss can be restricted while restricting the surge voltage.

According to a third aspect of the present disclosure, a semiconductor device has a semiconductor substrate including: a first conductivity-type drift layer; a second conductivity-type base layer disposed in a surface layer portion of the drift layer; and a second conductivity-type collector layer and a first conductivity-type cathode layer disposed opposite to the base layer with respect to the drift layer. In the semiconductor device, a region of the semiconductor substrate operating as an IGBT element is referred to as an IGBT region, and a region of the semiconductor substrate operating as a diode element is referred to as a diode region. The IGBT region and the diode region are alternately and repetitively arranged. The IGBT region and the diode region are divided from each other by a boundary between the collector layer and the cathode layer. The collector layer is referred to as a first collector layer. The semiconductor substrate is formed with a groove on a surface of the semiconductor substrate adjacent to the collector layer and the cathode, and at a position between the collector layer and the cathode layer, the groove being deeper than the collector layer and the cathode layer. The semiconductor substrate further includes an insulation layer disposed in the groove.

In the structure having the insulation layer between the IGBT region and the diode region, as described above, a recovery current flows in the drift layer having a relatively low concentration, and the amount of potential drop increases by the width of the insulation layer. Therefore, the injection amount of carriers by PN bias at the PN junction made of the collector layer and the drift layer increases. As such, the switching loss can be restricted while restricting the surge voltage.

BRIEF DESCRIPTION OF DRAWINGS

The above and other objects, features and advantages of the present disclosure will become more apparent from the following detailed description made with reference to the accompanying drawings, in which:

FIG. 4C is a cross-sectional view of a semiconductor device, used for simulation, having a high concentration collector layer in an IGBT region;

DETAILED DESCRIPTION

Hereinafter, embodiments of the present disclosure will be described with reference to the drawings. In the description of the embodiments, same or equivalent portions will be designated with the same reference numbers.

(First Embodiment)

A semiconductor device according to a first embodiment of the present disclosure will be described. The semiconductor device according to the present embodiment is made of an RC-IGBT structure having vertical-type IGBT and FWD, which allow a current to flow in a thickness direction of a substrate, in one substrate. The semiconductor device is, for example, suitably used for a power switching element disposed in a power supply circuit of an inverter, DC-to-DC converter, or the like. Specifically, the semiconductor device of the present embodiment has the following structure.

Figure 1:
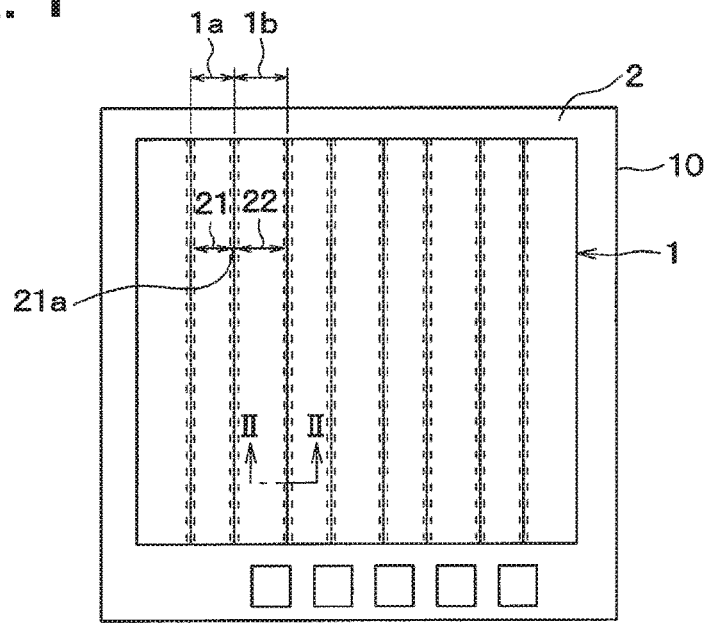
FIG. 1 is a schematic plan view of a semiconductor device according to a first embodiment of the present disclosure.

As shown in FIG. 1, the semiconductor device has a cell region 1 and an outer peripheral region 2 surrounding the cell region 1.

Figure 2:
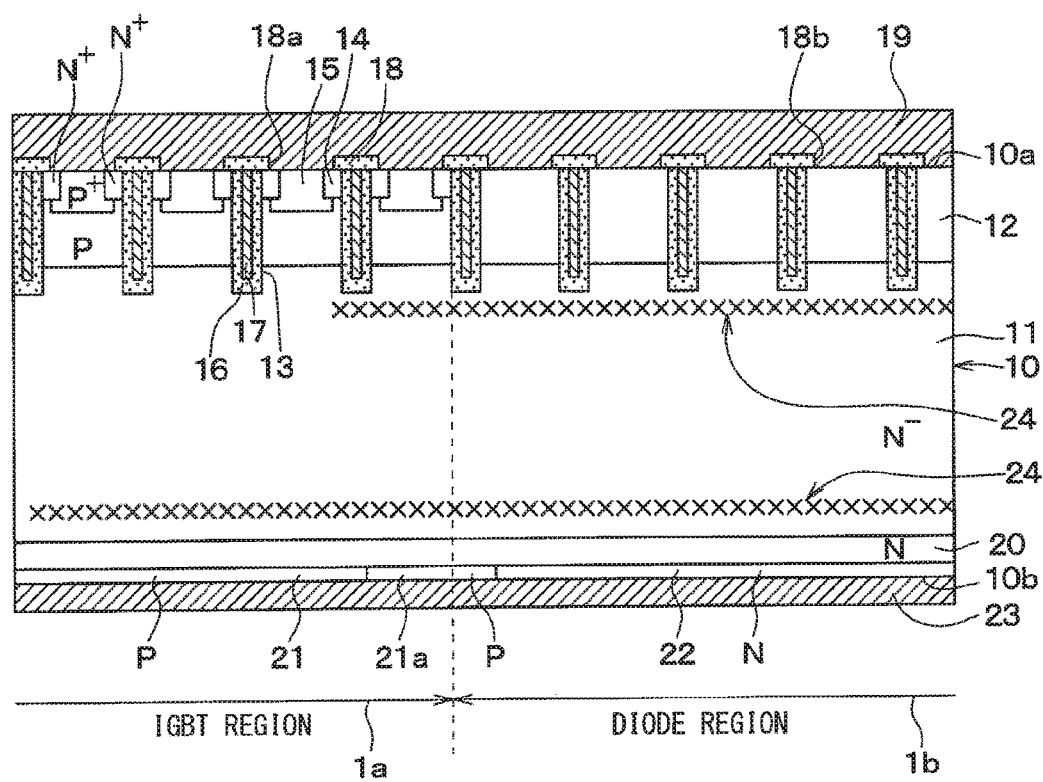
FIG. 2 is a cross-sectional view taken along a line II-II in FIG. 1.

As shown in FIG. 1 and FIG. 2, the cell region 1 includes IGBT regions 1a and diode regions 1b that are alternately arranged. Each IGBT region 1a is formed with an IGBT element, and each diode region 1b is formed with a diode element.

Specifically, these IGBT regions 1a and diode regions 1b are both formed in an n⁻-type semiconductor substrate 10 serving as a drift layer 11, as shown in FIG. 2, and thus formed into one chip. The IGBT regions 1a and the diode regions 1b extend in one direction (e.g., up and down direction in FIG. 1) along a surface 10a of the semiconductor substrate 10, and are alternately arranged in a direction orthogonal to the one direction along which the IGBT regions 1a and the diode regions 1b extend.

A p-type base layer 12 is formed on the drift layer 11, that is, on a side adjacent to the surface 10a of the semiconductor substrate 10. The base layer 12 is divided into plural sections by trenches 13 that penetrate the base layer 12 and reach the drift layer 11.

In the present embodiment, the trenches 13 are arranged at an equal interval in a direction included in the surface 10a of the semiconductor substrate 10 (i.e., a direction orthogonal to a paper surface of FIG. 2). The surface 10a of the semiconductor substrate 10 is provided by a surface of the base layer 12 opposite to the drift layer 11.

The base layer 12 serves as a channel region in the IGBT region 1a. The base layer 12 as the channel region, that is, the base layer 12 of the IGBT region 1a is formed with $n^+$-type emitter regions 14 and a $p^+$-type body region 15. The body region 15 is disposed between the emitter regions 14.

The emitter regions 14 have an impurity concentration higher than the drift layer 11. The emitter regions 14 are ended within the base layer 12, and are in contact with side surfaces of the trenches 13. The body region 15 has an impurity concentration higher than the base layer 12. Similar to the emitter regions 14, the body region 15 is ended within the base layer 12.

More specifically, the emitter regions 14 are disposed in a region defined between the adjacent trenches 13. The emitter regions 14 extend in a longitudinal direction of the trenches 13 as in a shape of rod, and are in contact with the side surfaces of the trenches 13. Further, the emitter regions 14 are ended more inside than the ends of the trenches 13. The body region 15 extends in the longitudinal direction of the trenches 13 and is disposed between the two emitter regions 14. That is, the body region 15 extends along the emitter regions 14 as in a shape of rod. The body region 15 of the present embodiment is deeper than the emitter regions 14, with respect to the surface 10a of the semiconductor substrate 10.

Each of the trenches 13 is filled with a gate insulation film 16 and a gate electrode 17. The gate insulation film 16 is formed to cover an inner wall surface forming the trench 13. The gate electrode 17 is formed on the gate insulation film 16. The gate electrode 17 is made of a poly-silicon, for example. The gate insulation film 16 and the gate electrode 17 disposed in the trench 13 form a trench gate structure.

An interlayer insulation film 18, which is made of BPSG or the like, is disposed on the base layer 12, adjacent to the surface 10a of the semiconductor substrate 10. The interlayer insulation film 18 is formed with contact holes 18a, in the IGBT regions 1a, so as to expose a part of each emitter region 14 and the body regions 15, and contact holes 18b, in the diode regions 1b, so as to expose the base layer 12.

An upper electrode 19 is arranged on the interlayer insulation film 18. The upper electrode 19 is electrically connected to the emitter regions 14 and the body regions 15 through the contact holes 18a in the IGBT regions 1a. The upper electrode 19 is also electrically connected to the base layer 12 through the contact holes 18b in the diode regions 1b. That is, the upper electrode 19 serves as an emitter electrode in the IGBT regions 1a, and serves as an anode electrode in the diode region 1b.

A FS layer 20 is disposed on the drift layer 11 on a side opposite to the base layer 12, that is, adjacent to the other surface 10b of the semiconductor substrate 10. The FS layer 20 has an n-type impurity concentration higher than that of the drift layer 11. Although the FS layer 20 is not always necessary, it is disposed for purposes of improving performances in consideration to breakdown voltage and steady loss by restricting an expansion of a depletion layer, as well as limiting an injection amount of holes injected from the side adjacent to the other surface 10b of the semiconductor substrate 10. For example, the FS layer 20 has an n-type impurity concentration of $1\times10^{15}$ to $1\times10^{16}$ cm$^{-3}$.

In the IGBT region 1a, a p-type collector layer 21, which corresponds to a first collector layer, is disposed opposite to the drift layer 11 with respect to the FS layer 20. In the diode region 1b, an n-type cathode layer 22 is disposed opposite to the drift layer 11 with respect to the FS layer 20. That is, the IGBT region 1a and the diode region 1b are divided from each other by the collector layer 21 and the cathode layer 22 that are disposed on a side of the semiconductor substrate 10 adjacent to the other surface 10b of the semiconductor substrate 10. For example, the collector layer 21 has a p-type impurity concentration of $1\times10^{17}$ to $1\times10^{18}$ cm$^{-3}$, and a width of 1500 µm or less in an arrangement direction of the collector layer 21 and the cathode layer 22. The cathode layer 22 has an n-type impurity concentration of $1\times10^{19}$ cm$^{-3}$, and a width of 500 µm or less in the arrangement direction of the collector layer 21 and the cathode layer 22. The formation interval of the collector layer 21 and the cathode layer 22 is substantially 500 µm to 2 mm.

Between the IGBT region 1a and the diode region 1b, a high concentration collector layer 21a, which corresponds to a second collector layer, is disposed. The high concentration collector layer 21a has an impurity concentration higher than the collector layer 21. Specifically, as shown by dashed lines in FIG. 1, the high concentration collector layer 21a is disposed to extend in the longitudinal direction of the trench gate structures at a boundary between the IGBT region 1a and the diode region 1b. In the present embodiment, the high concentration collector layer 21a extends in the longitudinal direction such that opposite ends of the high concentration collector layer 21a reach the outer peripheral region 2.

The high concentration collector layer 21a forms the collector of the IGBT together with the collector layer 21. Since the high concentration collector layer 21a has the impurity concentration higher than that of the collector layer 21, a large amount of holes can be injected in a recovery operation of the FWD. For example, the high concentration collector layer 21a has a p-type impurity concentration of twice or more of the p-type impurity concentration of the collector layer 21. Preferably, the p-type impurity concentration of the high concentration collector layer 21a is ten times or more of the p-type impurity concentration of the collector layer 21. In the present embodiment, the p-type impurity concentration of the high concentration collector layer 21a is $1\times10^{18}$ to $1\times10^{19}$ cm$^{-3}$. The width of the high concentration collector layer 21a is 100 µm or less in the arrangement direction of the collector layer 21 and the cathode layer 22. The width of the high concentration collector layer 21a is 10% or more of the width of the cathode layer 22 in the arrangement direction of the collector layer 21 and the cathode layer 22.

In the present embodiment, the other surface 10b of the semiconductor substrate 10 is provided by the collector that is made of the collector layer 21 and the high concentration collector layer 21a, and the cathode layer 22. In the present embodiment, the collector layer 21 is disposed on the side opposite to an area of the base layer 12 formed with the emitter regions 14 and the body region 15, with respect to the FS layer 20. Further, the cathode layer 22 is disposed on the side opposite to an area of the base layer 12 without having the emitter regions 14 and the body region 15, with respect to the FS layer 20. Further, the high concentration collector layer 21a is disposed between the collector layer 21 and the cathode layer 22.

That is, in the present embodiment, the boundary between the IGBT region 1a and the diode region 1b is defined by the boundary between the area of the base layer 12 formed with the emitter regions 14 and the body region 15 and the area of the base layer 12 without having the emitter regions 14 and the body region 15. Further, the high concentration collector layer 21a is disposed at the boundary between the IGBT region 1a and the diode region 1b.

As described above, the semiconductor substrate 10 has the base layer 12 on the side adjacent to the surface 10a, and the collector layer 21 and the cathode layer 22 on the side adjacent to the other surface 10b. Thus, the semiconductor substrate 10 may be configured by a substrate in which the collector layer 21 and cathode layer 22, the FS layer 20, the drift layer 11, and the base layer 12 are stacked in order.

The lower electrode 23 is disposed on the collector layer 21, the high concentration collector layer 21a and the cathode layer 22 (that is, on the other surface 10b of the semiconductor substrate 10). The lower electrode 23 serves as the collector electrode in the IGBT region 1a, and serves as the cathode electrode in the diode region 1b.

According to the configuration described above, in the IGBT region 1a, the IGBT element is configured in such a manner that the base is provided by the base layer 12, the emitter is provided by the emitter regions 14, and the collector is provided by the collector layer 21 and the high concentration collector layer 21a. In the diode region 1b, the diode element is provided in such a manner that the anode is provided by the base layer 12 and the cathode, which has an PN junction with the anode, is provided by the drift layer 11, the FS layer 20 and the cathode layer 22.

Further, the semiconductor substrate 10 is formed with damage regions 24 adjacent to the surface 10a and the other surface 10b. Specifically, the damage region 24 adjacent to the surface 10a is disposed in the diode region 1b, and is also extended from the diode region 1b to the IGBT region 1a. That is, the damage region 24 is disposed in the diode region 1b and in a portion of the IGBT region 1a adjacent to the boundary between the diode region 1b and the IGBT region 1a. The damage region 24 adjacent to the other surface 10b is disposed to extend entirely in the diode region 1b and the IGBT region 1a.

Since the semiconductor substrate 10 has the damage regions 24 as described above, the holes (excess carriers) in the drift layer 11 of the IGBT region 1a are recombined with the damage region 24 of the IGBT region 1a, and disappear. Therefore, the injection of the holes from the IGBT region 1a to the diode region 1b can be restricted.

Next, functions or the like of the high concentration collector layer 21a having the structures described above will be explained.

Figure 3A:
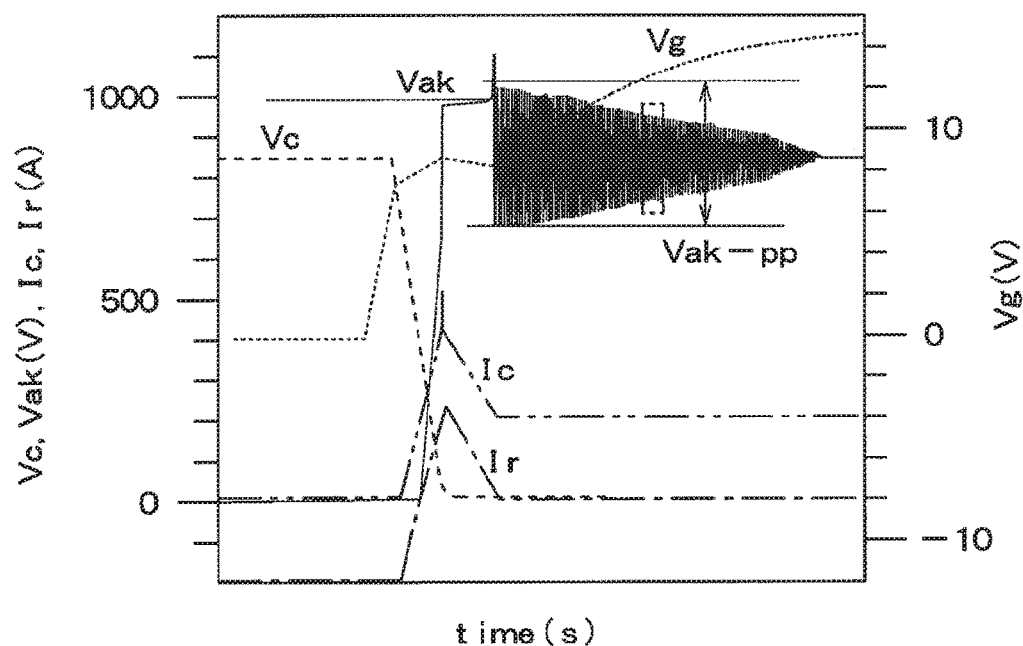
FIG. 3A is a diagram illustrating waveforms of a gate voltage Vg, a collector current Ic, a collector voltage Vc, an anode-to-cathode voltage Vak, and a recovery current Ir in a recovery operation.
Figure 3B:
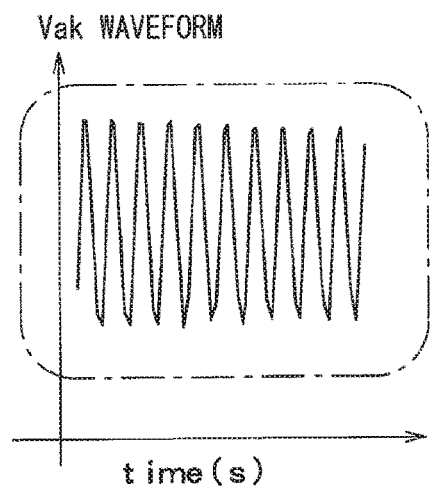
FIG. 3B is an enlarged view of a section encompassed with a dashed line in FIG. 3A.

In a conventional structure without having the high concentration collector layer 21a, the recovery waveform of the FWD oscillates, and thus the surge voltage is likely to easily increase. Specifically, in a recovery operation, a gate voltage Vg, a collector current Ic, a collector voltage Vc, an anode-to-cathode voltage Vak, and a recovery current Ir have waveforms as shown in FIG. 3A and FIG. 3B. According to FIG. 3A and FIG. 3B, it can be appreciated that the anode-to-cathode voltage Vak oscillates. The anode-to-cathode voltage Vak is oscillated due to parasitic capacitance and parasitic inductance of an external circuit when carriers adjacent to the other surface 10b is depleted during the recovery operation of the FWD.

Therefore, in the present embodiment, the high concentration collector layer 21a is formed in addition to the collector layer 21 on the side adjacent to the other surface 10b, and the collector layer 21 is made to have a lower impurity concentration. As such, the holes can be injected through the high concentration collector layer 21a during the recovery, without harming the switching loss. By this configuration, it is less likely that the carriers on the side adjacent to the other surface 10b will be depleted during the recovery. Thus, the oscillation of the anode-to-cathode voltage Vak can be restricted. This effect can be obtained as the high concentration collector layer 21a having the higher impurity concentration than the collector layer 21 is formed at a part, on the side adjacent to the other surface 10b. Further, it was confirmed that this effect is enhanced when the high concentration collector layer 21a is arranged between the IGBT region 1a and the diode region 1b, that is, between the collector layer 21 and the cathode layer 22.

Figure 4A:
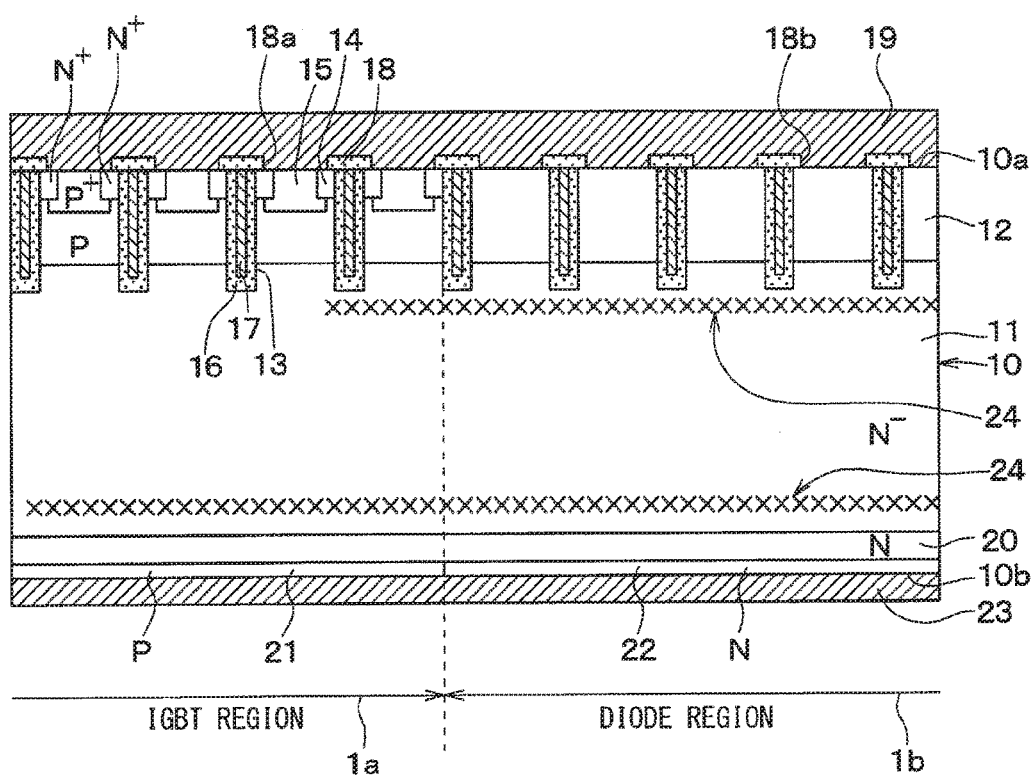
FIG. 4A is a cross-sectional view of a conventional semiconductor device, as a comparative example, used for simulation.
Figure 5:
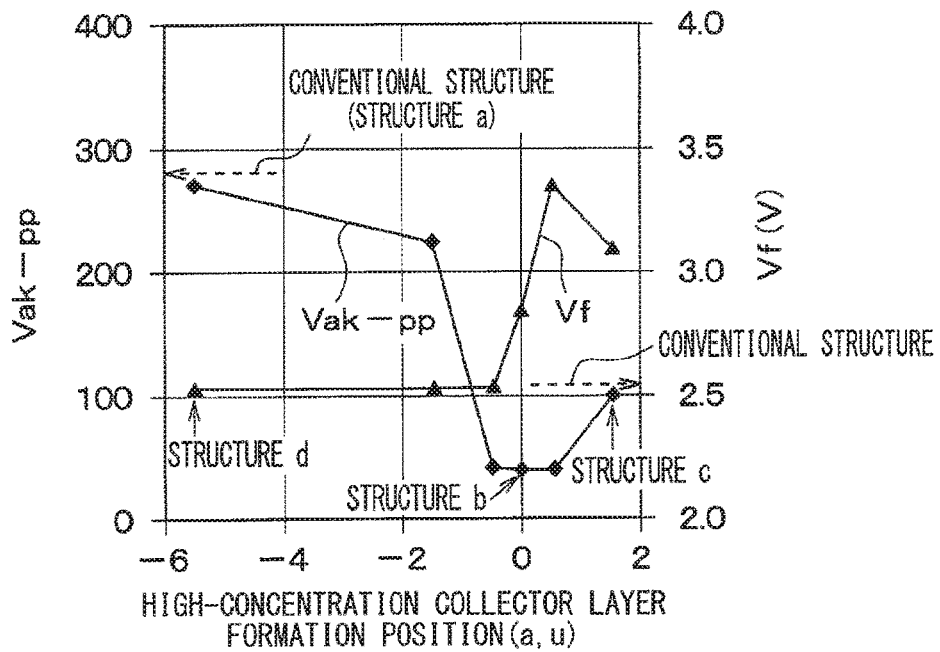
FIG. 5 is a graph showing a relationship between a formation position of the high concentration collector layer and an oscillation voltage Vak-pp and a relationship between the formation position of the high concentration collector layer and a diode forward voltage Vf.

Specifically, a diode forward voltage Vf and an oscillation voltage Vak-pp that is represented by a difference between a maximum value and a minimum value of the anode-to-cathode voltage Vak in accordance with the change in formation position of the high concentration collector layer 21a are calculated. FIG. 5 shows the results of the calculation. In FIG. 5, the formation position of the high concentration collector layer 21a is defined as zero when the high concentration collector layer 21a is at the boundary between the IGBT region 1a and the diode region 1b. The formation position of the high concentration collector layer 21a is represented with a negative value when the high concentration collector layer 21a is moved toward the IGBT region 1a from the boundary. The formation position of the high concentration collector layer 21a is represented with a positive value when the high concentration collector layer 21a is moved toward the diode region 1b from the boundary. In FIG. 5, dashed-line arrows represent the diode forward voltage Vf and the oscillation voltage Vak-pp of the structure a shown in FIG. 4A, that is, a conventional structure without having the high concentration collector layer 21a.

Figure 4B:
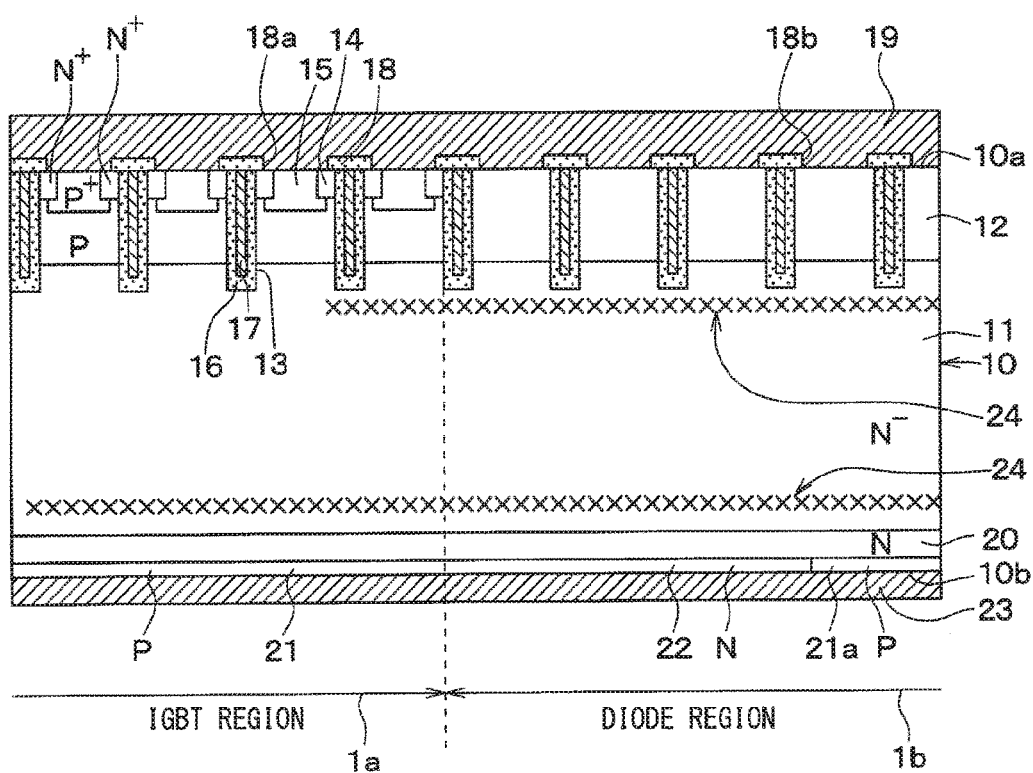
FIG. 4B is a cross-sectional view of a semiconductor device, used for simulation, having a high concentration collector layer in a diode region.

Note that structures b to d in FIG. 5 indicate states when the formation position of the high concentration collector layer 21a is shifted. The structure b corresponds to the structure of the present embodiment shown in FIG. 2, that is, the structure where the high concentration collector layer 21a is disposed between the IGBT region 1a and the diode region 1b. The structure c corresponds to the structure where the high concentration collector layer 21a is disposed at the center of the diode region 1b, as shown in FIG. 4B. The structure d corresponds to the structure where the high concentration collector layer 21a is disposed at the center of the IGBT region 1a, as shown in FIG. 4C. In these simulations, the width of the high concentration collector layer 21a is set to a width half of the width of the diode region 1b. Further, the impurity concentration of the FS layer 20 is $1 \times 10^{15}$ to $1 \times 10^{16}$ cm$^{-3}$, the impurity concentration of the collector layer 21 is $1 \times 10^{17}$ to $1 \times 10^{18}$ cm$^{-3}$, and the impurity concentration of the cathode layer 22 is $1 \times 10^{19}$ cm$^{-3}$. The impurity concentration of the high concentration collector layer 21a is higher than that of the collector layer 21.

According to FIG. 5, as compared with the conventional structure a, although the oscillation voltage Vak-pp of the structure d is not largely changed, the oscillation voltages Vak-pp of the structures b and c are largely reduced. In particular, in the structure b, the oscillation voltage Vak-pp is reduced to approximately 40 V.

Further, as shown in FIG. 5, as compared with the conventional structure a, although the diode forward voltage Vf of the structure d is not largely changed, the diode forward voltages Vf of the structures b and c are largely increased. In particular, the diode forward voltages Vf of the structure a and d are 2.5 V, whereas the diode forward voltage Vf of the structure b is approximately 2.8 V and the diode forward voltage Vf of the structure c is approximately 3.1 V. In both of the structures b and c, although the diode forward voltages Vf are higher than the structures a and d, the amount of increase of the diode forward voltages Vf is relatively small, because of the high concentration collector layer 21a being formed only at a part and not formed in a large area. In particular, the amount of increase of the diode forward voltage Vf of the structure b is smaller than that of the structure c.

As described hereinabove, since the semiconductor substrate 10 is provided with the high concentration collector layer 21a, the oscillation of the recovery waveform, that is, the oscillation voltage Vak-pp can be restricted without increasing the diode forward voltage Vf. As such, the surge voltage can be restricted. Further, since the high concentration collector layer 21a is provided only at a part of the collector, the switching loss can also be restricted. In particular, in the case where the formation position of the high concentration collector layer 21a is selected, that is, when the high concentration collector layer 21a is disposed between the IGBT region 1a and the diode region 1b, the surge voltage can be further restricted.

Figure 6:
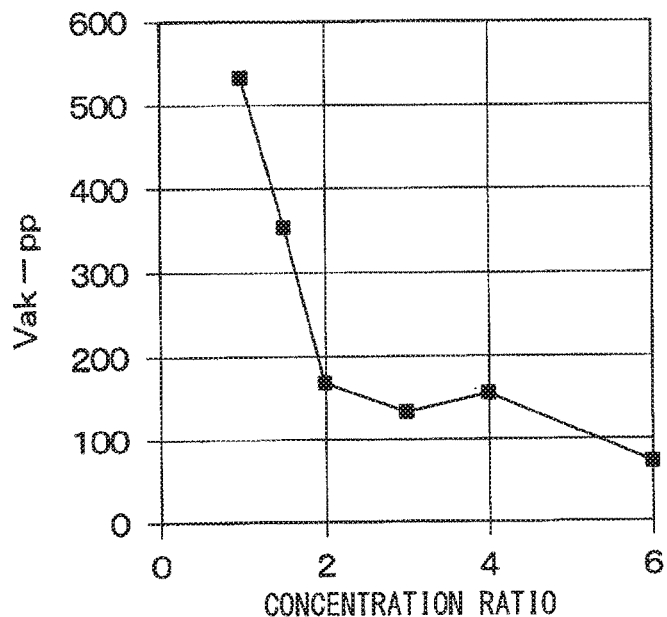
FIG. 6 is a graph showing a relationship between a concentration ratio and the oscillation voltage Vak-pp.

In the present embodiment, the p-type impurity concentration of the high concentration collector layer 21a is twice or more of the p-type impurity concentration of the collector layer 21. In this case, the oscillation voltage Vak-pp can be further reduced. In this regard, the oscillation voltage Vak-pp is examined while varying the ratio of the impurity concentration of the high concentration collector layer 21a to the collector layer 21 in the structure of the present embodiment. FIG. 6 shows the results of the examination.

As shown in FIG. 6, the oscillation voltage Vak-pp reduces with the increase of the concentration ratio. The oscillation voltage Vak-pp is substantially constant when the concentration ratio is two or more. Therefore, when the p-type impurity concentration of the high concentration collector layer 21a is set so that the concentration ratio of impurity of the high concentration collector layer 21a to the collector layer 21 is two or more, as in the present embodiment, the oscillation voltage Vak-pp can be effectively reduced. As such, the surge voltage can be restricted.

The semiconductor device of the present embodiment can be typically produced by a conventional production method. However, the high concentration collector layer 21a needs to be formed by an ion implantation using a mask different from a mask for forming the collector layer 21.

(Second Embodiment)

A second embodiment of the present disclosure will be described. In the present embodiment, the structure of the other surface 10b of the semiconductor substrate is modified from that of the first embodiment. The other structures of the present embodiment are similar to the first embodiment, and thus only the portions different from the first embodiment will be described.

Figure 7:
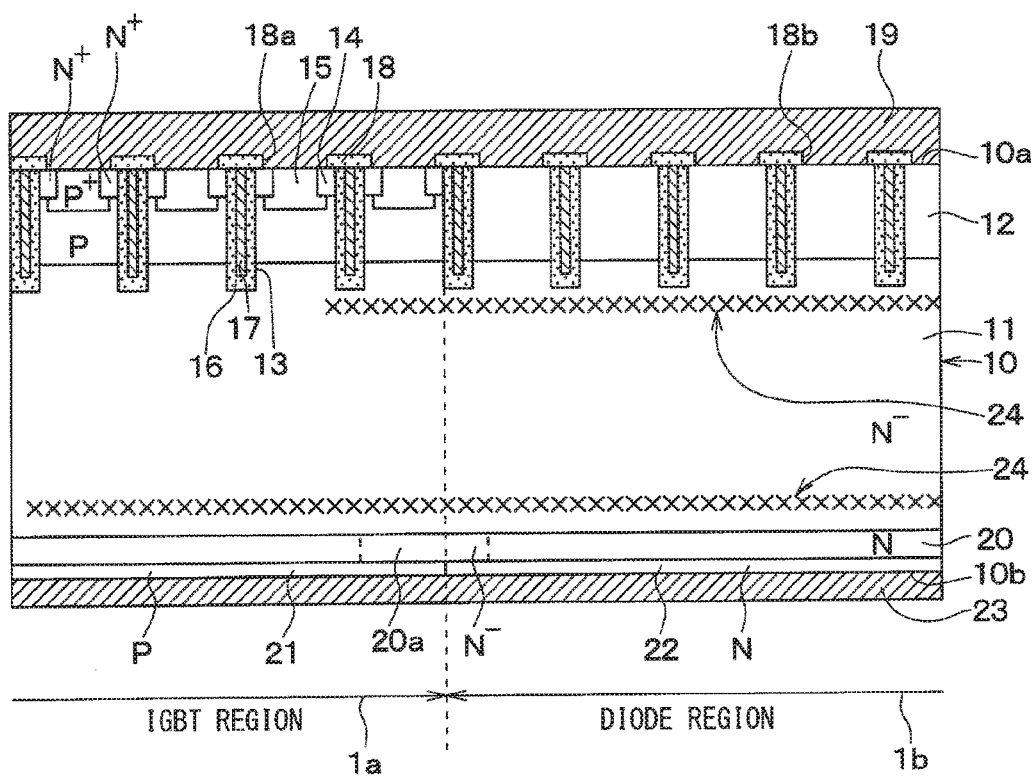
FIG. 7 is a cross-sectional view of a semiconductor device according to a second embodiment of the present disclosure.

As shown in FIG. 7, in the present embodiment, the semiconductor substrate 10 has the collector layer 21, but does not have the high concentration collector layer 21a as the first embodiment, between the IGBT region 1a and the diode region 1b. In place of the high concentration collector layer 21a, the semiconductor substrate 10 has a low concentration FS layer 20a between the IGBT region 1a and the diode region 1b, that is, at a position corresponding to the boundary between the collector layer 21 and the cathode layer 22. The low concentration FS layer 20a is provided by reducing the impurity concentration of the FS layer 20 at a part to be lower than the other area of the FS layer 20. For example, the FS layer 20 other than the low concentration FS layer 20a has an n-type impurity concentration of $1 \times 10^{15}$ to $1 \times 10^{16}$ cm$^{-3}$, and the low concentration FS layer 20a has the impurity concentration of $0.5 \times 10^{15}$ to $0.5 \times 10^{16}$ cm$^{-3}$, which is substantially half of the impurity concentration of the FS layer 20.

In the structure having the low concentration FS layer 20a as described above, the semiconductor substrate 10 can be made to a state where the injection amount of holes from the p-type impurity is increased by controlling balance of the impurity concentration of the PN junction. Therefore, similarly to the first embodiment, the switching loss can be restricted while restricting the surge voltage.

Figure 8:
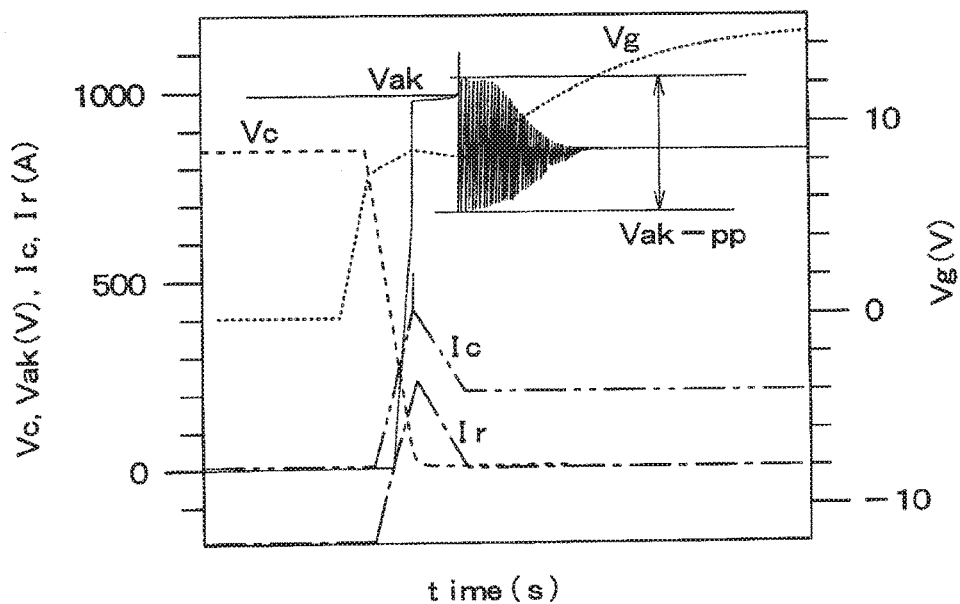
FIG. 8 is a diagram illustrating waveforms of a gate voltage Vg, a collector current Ic, a collector voltage Vc, an anode-to-cathode voltage Vak, and a recovery current Ir in a recovery operation.

Specifically, in the structure of the present embodiment, a collector current Ic, a collector voltage Vc, an anode-to-cathode voltage Vak, and a recovery current Ir in a recovery operation are examined and are shown in FIG. 8. As appreciated from waveforms in FIG. 8, the oscillation of the anode-to-cathode voltage Vak, which causes the surge voltage, is smaller in the structure of the present embodiment than that of the conventional structure shown in FIG. 3A. Based on this examination also, it is appreciated that the effect described above can be also achieved.

(Third Embodiment)

A third embodiment of the present disclosure will be described. Also in the present embodiment, the structure of the other surface 10b of the semiconductor substrate is modified from that of the first embodiment. The other structures of the present embodiment are similar to the first embodiment, and thus only the portions different from the first embodiment will be described.

Figure 9:
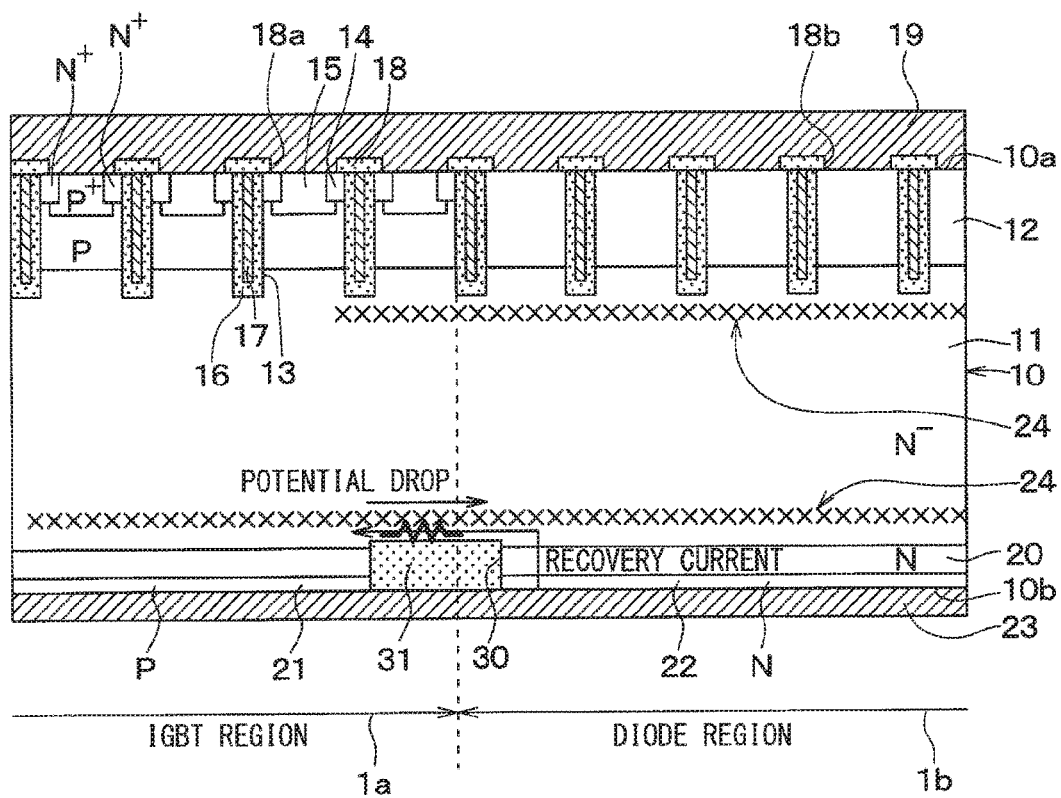
FIG. 9 is a cross-sectional view of a semiconductor device according to a third embodiment of the present disclosure.

As shown in FIG. 9, in the present embodiment, the semiconductor substrate 10 is formed with a groove 30 at a position corresponding to the boundary between the IGBT region 1a and the diode region 1b. The groove 30 is deeper than the collector layer 21 and the cathode layer 22, preferably, deeper than the FS layer 20. Further, an insulation layer 31 is disposed in the groove 30. A width of the groove 30 in an arrangement direction of the IGBT region 1a and the diode region 1b, that is, a width of the insulation layer 31 is, for example, 5 μm. A depth of the groove 30, that is, a thickness of the insulation layer 31 is, for example, 2.5 μm.

In the structure having the insulation layer 31 between the IGBT region 1a and the diode region 1b, as described above, a recovery current flows in the drift layer 11 having a relatively low concentration, and thus the amount of potential drop increases by the width of the insulation layer 31 (see FIG. 9). Therefore, the amount of hole injection by PN bias at the PN junction provided by the collector layer 21 and the FS layer 20 and drift layer 11 increases. As such, similar to the first embodiment, the switching loss can be restricted while restricting the surge voltage.

Figure 10:
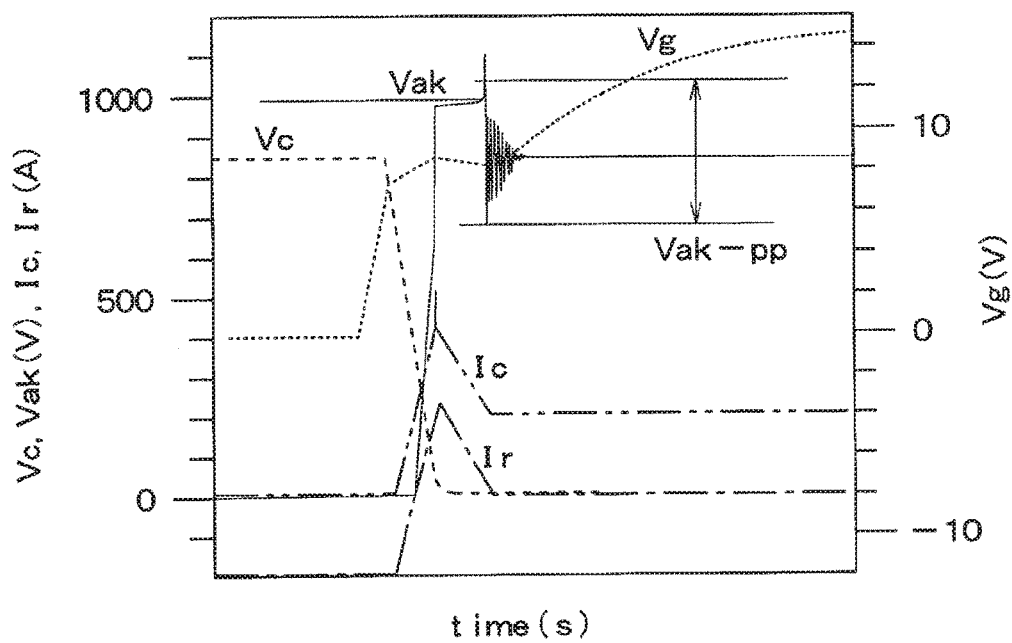
FIG. 10 is a diagram illustrating waveforms of a gate voltage Vg, a collector current Ic, a collector voltage Vc, an anode-to-cathode voltage Vak, and a recovery current Ir in a recovery operation.

Specifically, in the structure of the present embodiment, a collector current Ic, a collector voltage Vc, an anode-to-cathode voltage Vak, and a recovery current Ir in a recovery operation are examined and are shown in FIG. 10. As appreciated from waveforms in FIG. 10, the oscillation of the anode-to-cathode voltage Vak, which causes the surge voltage, is smaller in the structure of the present embodiment than that of the conventional structure shown in FIG. 3A. Based on this examination also, it is appreciated that the effect described above can be achieved.

(Other Embodiments)

The present disclosure is not limited to the embodiments described hereinabove, but can be suitably modified, for example, as follows.

In the above embodiments, the channels are formed in areas between all the trench gate structures. As another example, the semiconductor substrate 10 may have a thin structure in which emitter regions 14 are not formed between all the trench gate structures, and are eliminated at a predetermined interval. As another example of the thin structure, a hole barrier layer (hole stopper layer HS) may be formed in the base layer 12 in the area where the channel is not formed.

In the embodiments described hereinabove, the IGBT is exemplified as an n-channel type IGBT in which the first conductivity-type is the n-type and the second conductivity-type is the p-type. Further, the present disclosure can be applicable to a p-channel type IGBT in which the conductivity-type of each component is reversed from the n-channel type IGBT.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising a semiconductor substrate including:
a first conductivity-type drift layer;
a second conductivity-type base layer disposed in a surface layer portion of the drift layer; and
a second conductivity-type collector layer and a first conductivity-type cathode layer disposed opposite to the base layer with respect to the drift layer, wherein
in the semiconductor substrate, a region operating as an IGBT element is referred to as an IGBT region, and a region operating as a diode element is referred to as a diode region, and the IGBT region and the diode region are alternately and repetitively arranged,
the IGBT region and the diode region are divided from each other by a boundary between the collector layer and the cathode layer,
the collector layer and the cathode layer extend in a direction along a surface of the semiconductor substrate, and the collector layer and the cathode layer are alternately and repetitively arranged in a direction orthogonal to the direction in which the collector layer and the cathode layer extend,
the collector layer is referred to as a first collector layer, the semiconductor substrate further includes a second collector layer having a second conductivity-type impurity concentration higher than that of the first collector layer, at the surface of the semiconductor substrate along which the first collector layer and the cathode layer are disposed, and
the second collector layer is disposed between the first collector layer and the cathode layer, the second collector layer is located only at a position corresponding to a boundary between the IGBT region and the diode region, and the second collector layer is in contact with the cathode layer.

2. The semiconductor device according to claim 1, wherein
the second conductivity-type impurity concentration of the second collector layer is twice or more of a second conductivity-type impurity concentration of the first collector layer.

3. The semiconductor device according to claim 1, wherein
the semiconductor substrate further includes a damage layer to allow excess carriers generated in the drift layer to recombine and disappear, and
the damage layer is disposed in the drift layer of the diode region and extends over the boundary between the IGBT region and the diode region into a region of the drift layer of the IGBT region adjacent to the boundary between the IGBT region and the diode region.

4. A semiconductor device comprising a semiconductor substrate including:
a first conductivity-type drift layer;
a second conductivity-type base layer disposed in a surface layer portion of the drift layer;
a field stop layer disposed opposite to the base layer with respect to the drift layer, the field stop layer having a first conductivity-type impurity concentration higher than that of the drift layer; and
a second conductivity-type collector layer and a first conductivity-type cathode layer disposed opposite to the drift layer with respect to the field stop layer, wherein
in the semiconductor substrate, a region operating as an IGBT element is referred to as an IGBT region, and a region operating as a diode element is referred to as a diode region, and the IGBT region and the diode region are alternately and repetitively arranged,
the IGBT region and the diode region are divided from each other by a boundary between the collector layer and the cathode layer,
the semiconductor substrate further includes a low concentration field stop layer in the field stop layer, the low concentration field stop layer is located at only a position in the field stop layer corresponding to a boundary between the collector layer and the cathode layer, the low concentration field stop layer being in contact with the collector layer, the cathode layer and the drift layer, and the low concentration field stop layer having a first conductivity-type impurity concentration lower than that of portions of the field stop layer in the IGBT region and in the diode region other than the low concentration field stop layer.

5. The semiconductor device according to claim 4, wherein
the semiconductor substrate further includes a damage layer to allow excess carriers generated in the drift layer to recombine and disappear, and
the damage layer is disposed in the drift layer of the diode region and extends over the boundary between the IGBT region and the diode region into a region of the drift layer of the IGBT region adjacent to the boundary between the IGBT region and the diode region.

6. A semiconductor device comprising a semiconductor substrate including:
a first conductivity-type drift layer;
a second conductivity-type base layer disposed in a surface layer portion of the drift layer; and
a second conductivity-type collector layer and a first conductivity-type cathode layer disposed opposite to the base layer with respect to the drift layer, wherein
in the semiconductor substrate, a region operating as an IGBT element is referred to as an IGBT region, and a region operating as a diode element is referred to as a diode region, and the IGBT region and the diode region are alternately and repetitively arranged, the IGBT region and the diode region are divided from each other by a boundary between the collector layer and the cathode layer, the semiconductor substrate is formed with a groove on a surface of the semiconductor substrate adjacent to the collector layer and the cathode, the groove is located at only a position between the collector layer and the cathode layer corresponding to a boundary between the IGBT region and the diode region, the groove being deeper than the collector layer and the cathode layer, and the semiconductor substrate includes an insulation layer disposed in the groove.

7. The semiconductor device according to claim 6, wherein the semiconductor substrate further includes a damage layer to allow excess carriers generated in the drift layer to recombine and disappear, and the damage layer is disposed in the drift layer of the diode region and extends over the boundary between the IGBT region and the diode region into a region of the drift layer of the IGBT region adjacent to the boundary between the IGBT region and the diode region.

* * * * *